(12) United States Patent
Wada et al.

(10) Patent No.: US 7,345,927 B2
(45) Date of Patent: Mar. 18, 2008

(54) SEMICONDUCTOR INTEGRATED CIRCUIT DEVICE

(75) Inventors: Osamu Wada, Yokohama (JP); Toshimasa Namekawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 94 days.

(21) Appl. No.: 10/960,011

(22) Filed: Oct. 8, 2004

(65) Prior Publication Data

US 2005/0174866 A1    Aug. 11, 2005

(30) Foreign Application Priority Data

Feb. 10, 2004    (JP)    ............... 2004-033494

(51) Int. Cl.
*G11C 7/10*    (2006.01)

(52) U.S. Cl. .................. 365/189.01; 365/230.03; 365/156

(58) Field of Classification Search ............. 365/205, 365/207, 189.05, 49, 230.08, 189.01, 230.03, 365/156, 173, 230.05, 230.06
See application file for complete search history.

(56) References Cited

U.S. PATENT DOCUMENTS

| | | | |
|---|---|---|---|
| 5,724,292 A | * | 3/1998 | Wada .................. 365/207 |
| 6,885,593 B2 | * | 4/2005 | Mizuno et al. ........ 365/189.05 |
| 6,898,099 B1 | * | 5/2005 | Srinivasan et al. ........... 365/49 |
| 6,999,364 B2 | * | 2/2006 | Hosokawa et al. ......... 365/205 |
| 2001/0002886 A1 | * | 6/2001 | Ooishi ....................... 365/196 |
| 2004/0190350 A1 | * | 9/2004 | Wada ................... 365/189.07 |

FOREIGN PATENT DOCUMENTS

| | | |
|---|---|---|
| JP | 2-3146 | 1/1990 |
| JP | 2-226581 | 9/1990 |
| JP | 4-252493 | 9/1992 |
| JP | 10-162577 | 6/1998 |

OTHER PUBLICATIONS

Harold Pilo, et al. "A 5.6ns Random Cycle 144Mb DRAM with 1.4Gb/s/pin and DDR3-SRAM Interface", 2003 IEEE International Solid-State Circuits Conference, p. 308.

* cited by examiner

*Primary Examiner*—Van Thu Nguyen
*Assistant Examiner*—Dang Nguyen
(74) *Attorney, Agent, or Firm*—Oblon, Spivak, McClelland, Maier & Neustadt, P.C.

(57) ABSTRACT

A semiconductor integrated circuit device includes a plurality of sense amplifier line pairs, a plurality of sense amplifier latch circuits respectively connected to the sense amplifier line pairs, and a sense amplifier driver circuit which supplies a sense amplifier activation signal to the sense amplifier latch circuits. The sense amplifier driver circuit is provided for each of the plurality of sense amplifier latch circuits and supplies the sense amplifier activation signal to each of the plurality of sense amplifier latch circuits.

20 Claims, 8 Drawing Sheets

In case where potential of equalization control signal is high

In case where potential of equalization control signal is low.

SEMICONDUCTOR INTEGRATED CIRCUIT DEVICE

CROSS-REFERENCE TO RELATED APPLICATIONS

This application is based upon and claims the benefit of priority from the prior Japanese Patent Application No. 2004-33494, filed Feb. 10, 2004, the entire contents of which are incorporated herein by reference.

BACKGROUND OF THE INVENTION

1. Field of the Invention

This invention relates to a semiconductor integrated circuit device and more particularly to a semiconductor integrated circuit device having a semiconductor memory.

2. Description of the Related Art

In a semiconductor memory, for example, in a DRAM, when data is written into a memory cell, if data stored in the memory cell and data input from the exterior are different from each other, it is necessary to invert the data output state held in a sense amplifier.

An example of the waveform at the time of writing bit line data is shown in FIG. 14.

The potential of a word line WL<0> designated by a row address signal (not shown) is set to a high level and data of a memory cell corresponding to the word line is read out and supplied to a bit line BL<0> and amplified by a sense amplifier. If the DRAM is set in a write operation mode, data input from the exterior is written into the sense amplifier by turning on a column selection transistor (not shown) connected between the sense amplifier and a data line. At this time, it is necessary to invert the output state of the sense amplifier and reverse the potential relation between paired bit lines if data read out from the memory cell is different from data input from the exterior. As a result, the write time becomes correspondingly longer.

Therefore, a technique for activating the sense amplifier at the write operation time, transferring data to the bit line before completion of amplification, setting the paired bit lines to potentials corresponding to write data in a state in which the potential levels of the paired bit lines are not changed to the full amplitudes and amplifying the potential difference by use of the sense amplifier is provided. This technique is disclosed in document 1. According to document 1, a column selection signal is input at different timings in the read operation and in the write operation and the input timing in the write operation time is set at earlier timing.

The potential of the word line is set to a high level and data of a memory cell corresponding to the word line appears as infinitesimal potential on the bit line and is started to be amplified by the sense amplifier. When the DRAM is set in the write operation mode, data input from the exterior is written onto the bit line before amplification of the data by the sense amplifier is completed. In this case, time required for inverting the output state of the sense amplifier becomes shorter in comparison with the waveform shown in FIG. 14. As a result, the write time becomes correspondingly shorter.

Document 1: Jpn. Pat. Appln. KOKAI Publication No. 2-226581

BRIEF SUMMARY OF THE INVENTION

A semiconductor integrated circuit device according to an aspect of the present invention comprises a memory cell array including a plurality of word lines, a plurality of bit line pairs and memory cells arranged at intersections between the plurality of word lines and the plurality of bit line pairs; a plurality of sense amplifier line pairs respectively connected to the plurality of bit line pairs; a plurality of sense amplifier latch circuits which are respectively connected to the plurality of sense amplifier line pairs and each of which amplifies and holds data of the memory cell; and sense amplifier driver circuits which respectively supply sense amplifier activation signals to the plurality of sense amplifier latch circuits, a sense amplifier driver circuit being provided for each of the plurality of sense amplifier latch circuits and supplying the sense amplifier activation signal to a corresponding one of the plurality of sense amplifier latch circuits.

DETAILED DESCRIPTION OF THE INVENTION

Figure 14:
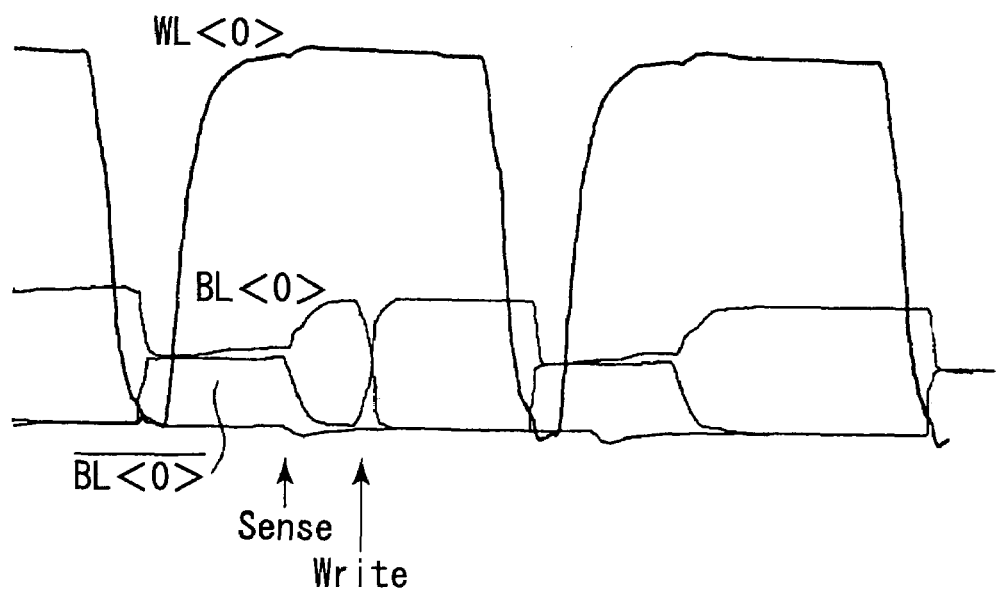
FIG. 14 is an operation waveform diagram showing the operation of the conventional semiconductor memory.

If the bit line is driven according to waveforms shown in FIG. 14 or document 1, the write operation of inverting data of a memory cell after the potential of the word line is set to the high level is performed. Therefore, it takes a long time to write new data into the memory cell and delay the cycle operation. Particularly, in a product such as a network equipment or cache memory which is required to perform the high-speed cycle operation, there occurs a problem that the requirement cannot be satisfied.

There will now be described an embodiment of this invention with reference to the accompanying drawings. In this explanation, common reference symbols are attached to like portions throughout the drawings.

Figure 1:
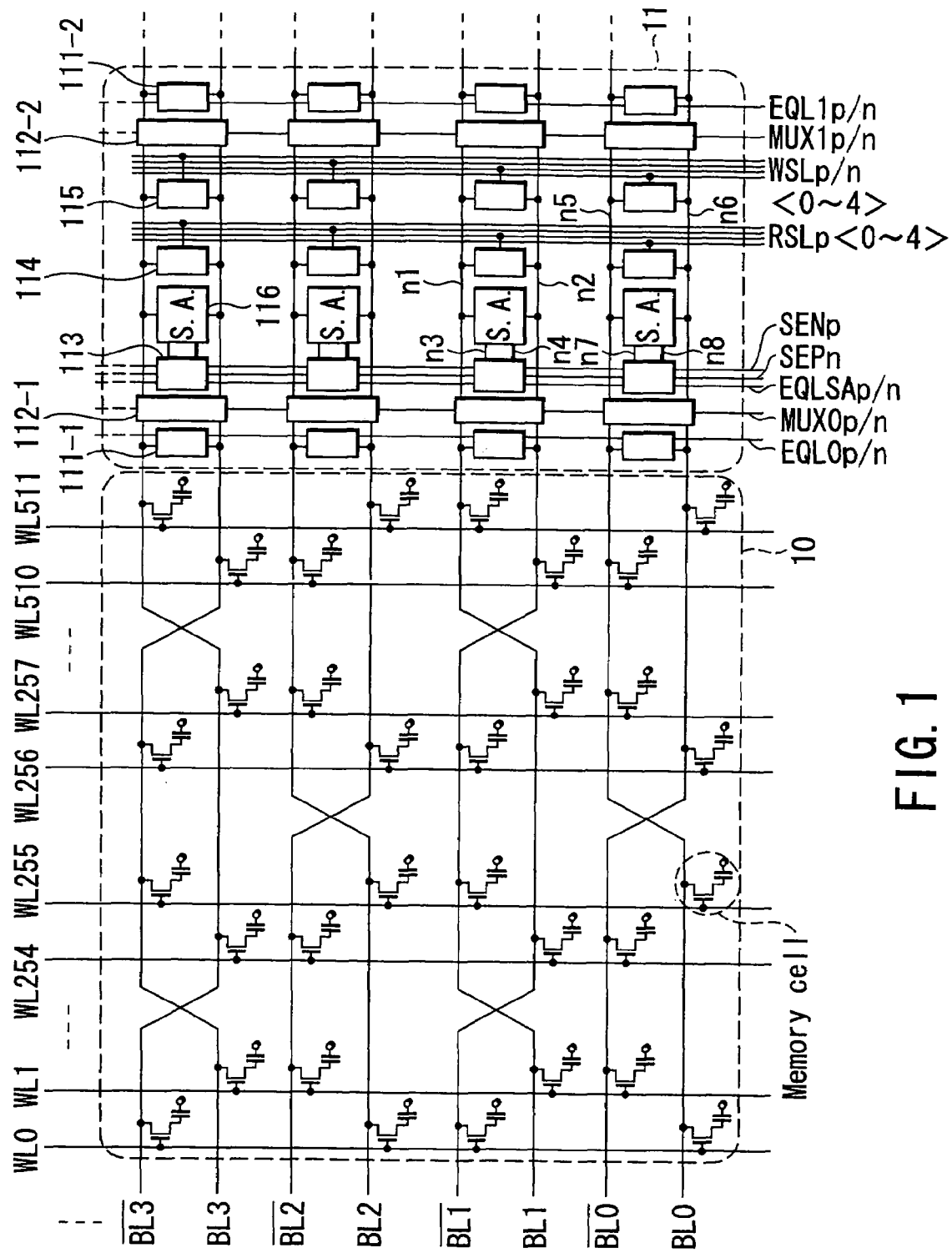
FIG. 1 is a block diagram schematically showing an example of the configuration of a memory cell array part and sense amplifier part of a semiconductor memory according to one embodiment of this invention.

FIG. 1 is a block diagram schematically showing an example of the configuration of a memory cell array part and sense amplifier part of a semiconductor memory according to one embodiment of this invention.

As shown in FIG. 1, the semiconductor memory includes a memory cell array part 10 and sense amplifier part 11. A control circuit of a memory core such as a sense amplifier control circuit, row decoder and column decoder are provided around the memory cell array part 10 and sense amplifier part 11. In FIG. 1, the sense amplifier control circuit, row decoder and column decoder are omitted for brevity of the drawing.

In the memory cell array part 10, four pairs of complementary bit lines BL0 to BL3 and /BL0 to /BL3 and eight word lines WL0, WL1, ..., WL254 to WL257, ..., WL510, WL511 are shown as an example. Memory cells are arranged at intersections between the word lines and the bit lines. Each memory cell is configured by a transistor and a capacitor. A gate of the transistor is connected to a corresponding one of the word lines. In FIG. 1, the four pairs of complementary bit lines are shown for convenience in order to simplify the explanation, but the number of complementary bit line pairs is not limited to four. The bit line pairs BL0, /BL0 and BL2, /BL2 among the complementary bit line pairs are configured in a twist form in which the complementary bit line pairs cross each other and are switched in position at one portion between the word lines WL0 and WL511 (in the case of FIG. 1, between the word lines WL255 and WL256). Further, the bit line pairs BL1, /BL1 and BL3, /BL3 are configured in a twist form in which the complementary bit line pairs cross each other and are switched in position at two portions between the word lines WL0 and WL511 (for example, between the word lines WL127 and WL128 (not shown) and between the word lines WL383 and WL384 (not shown)).

The sense amplifier part 11 includes bit line pair equalization circuits 111-1 and 111-2, transfer gates 112-1, 112-2, sense amplifier driver circuits and sense amplifier line pair equalization circuits 113, read gate circuits 114, write buffer circuits 115 and sense amplifier latch circuits (S.A.) 116.

For example, the sense amplifier part 11 is a shared type sense amplifier part and a memory cell array part 10 is provided on the side opposite to the sense amplifier part 11 although it is not shown in the drawing. Equalization control signals EQL0p, EQL0n and EQL1p, EQL1n are input to the bit line pair equalization circuits 111-1 and 111-2 to equalize potentials of the bit lines on the memory cell array part 10 to intermediate potential. Control signals MUX0p, MUX0n and MUX1p, MUX1n are input to the transfer gates 112-1, 112-2 to control whether or not data of the bit line is transferred to the sense amplifier line. For example, the sense amplifier line is a bit line connected to a sense amplifier latch circuit 116 in the sense amplifier part 11. The sense amplifier driver circuit and sense amplifier line pair equalization circuit 113 is supplied with signals SENp, SEPn which are used to control the sense amplifier driver and signals EQLSAp, EQLSAn which are used to control equalization of the paired sense amplifier lines. Further, it has a function of supplying potential used to operate the sense amplifier latch circuit 116 and a function of equalizing the paired sense amplifier line. Read select signals RSLp<0> to RSLp<4> are input to the respective read gate circuits 114 and data amplified by the sense amplifier latch circuit 116 is transferred to a readout data line according to the selected read select signal. Write select signals WSLp<0> to WSLp<4> are input to the write buffer circuit 115 and data on a write data line is written onto the bit line according to the selected write select signal. The sense amplifier latch circuit 116 is connected to the complementary sense amplifier line pair and supplied with signals (for example, n3, n4, n7, n8) output from the sense amplifier driver circuit and sense amplifier line pair equalization circuit 113. Then, data read out from the memory cell or data to be written into the memory cell is amplified.

Figure 2:
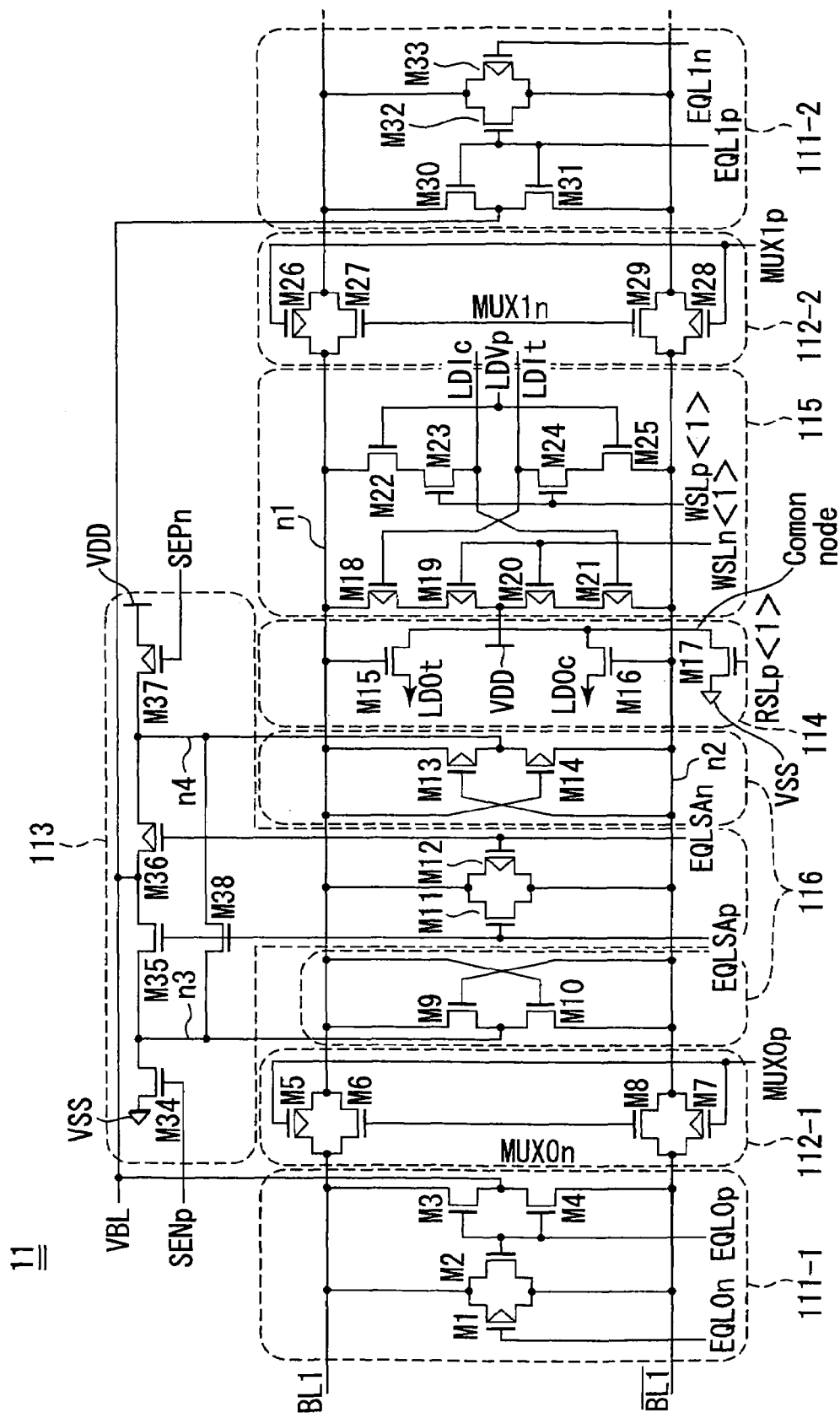
FIG. 2 is a circuit diagram showing an example of the circuit of the sense amplifier part of the semiconductor memory according to the embodiment of this invention.

FIG. 2 shows an example of the detailed configuration of the bit line pair equalize circuits 111-1, 111-2, transfer gates 112-1, 112-2, sense amplifier driver circuit and sense amplifier line pair equalization circuit 113, read gate circuit 114, write buffer circuit 115 and sense amplifier latch circuit 116 in the sense amplifier part 11 shown in FIG. 1 while attention is paid to the bit lines BL1 and /BL1.

The bit line pair equalization circuit 111-1 includes N-channel MOS transistors (which are hereinafter referred to as NMOSs) M2, M3, M4 controlled by the equalization control signal EQL0p and a P-channel MOS transistor (which is hereinafter referred to as a PMOS) M1 controlled by the complementary equalize control signal EQL0n. The PMOS M1 and NMOS M2 are connected in parallel between the bit lines BL1 and /BL1 and the NMOSs M3, M4 are serially connected between the bit lines BL1 and /BL1. Equalization potential VBL is applied to a connection node of the NMOSs M3 and M4. For example, one example of the equalization potential VBL is intermediate voltage between the ground potential VSS and power supply potential VDD. For example, the equalization potential is VDD/2. The bit lines BL1, /BL1 are controlled to be set to the equalization potential VBL when the equalization control signal EQL0p is set to the high level and the complementary equalization control signal EQL0n is set to the low level. It is not always necessary to use boosted potential as the equalization control signals EQL0p, EQL0n. One example of the boosted potential is potential which drives the word line, for example.

The bit line pair equalization circuit 111-2 has the same configuration as the bit line pair equalization circuit 111-1. NMOSs M32, M30, M31 of the bit line pair equalization circuit 111-2 correspond to the NMOSs M2, M3, M4 and a PMOS M33 corresponds to the PMOS M1. The NMOSs M32, M30, M31 are controlled by the equalization control signal EQL1p and the PMOS M33 is controlled by the equalization control signal EQL1n.

The transfer gate 112-1 includes a PMOS M5 and NMOS M6 which are connected at one end to the bit line BL1, and a PMOS M7 and NMOS M8 which are connected at one end to the bit line /BL1. The gates of the PMOSs M5, M7 are supplied with the control signal MUX0p and the gates of the NMOSs M6, M8 are supplied with the complementary control signal MUX0n. The other ends of the PMOS M5 and NMOS M6 are connected to a sense amplifier line n1 and the other ends of the PMOS M7 and NMOS M8 are connected to a sense amplifier line n2. Thus, the transfer gate 112-1 of this example is a CMOS type transfer gate. The CMOS type transfer gate has the effect that occurrence of a drop in the threshold voltage when potential from the bit line is transferred to the sense amplifier line can be prevented. Therefore, it is not necessary to use the boosted potential as the control signals MUX0p, MUX0n.

The transfer gate 112-2 has the same configuration as the transfer gate 112-1. PMOSs M26, M28 of the transfer gate 112-2 correspond to the PMOSs M5, M7 and NMOSs M27, M29 correspond to the NMOSs M6, M8. The PMOSs M26, M28 are controlled by the control signal MUX1p and the NMOSs M27, M29 are controlled by the control signal MUX1n.

The sense amplifier latch circuit 116 is connected to the paired sense amplifier lines n1, n2. The sense amplifier latch circuit 116 amplifies data transferred from the paired bit lines BL1, /BL1 to the paired sense amplifier lines n1, n2 and holds (latches) the thus amplified data. The sense amplifier latch circuit 116 includes NMOSs M9, M10 and PMOSs M13, M14. The NMOSs M9, M10 are serially connected between the paired sense amplifier lines n1 and n2, the gate of the NMOS M9 is connected to the sense amplifier line n2 and the gate of the NMOS M10 is connected to the sense amplifier line n1. Likewise, the PMOSs M13, M14 are serially connected between the paired sense amplifier lines n1 and n2, the gate of the PMOS M13 is connected to the sense amplifier line n2 and the gate of the PMOS M14 is connected to the sense amplifier line n1. A sense amplifier activation signal n3 is applied to a connection node of the NMOSs M9 and M10 and a sense amplifier activation signal n4 is applied to a connection node of the PMOSs M13 and M14. The sense amplifier activation signals n3, n4 are output from the sense amplifier driver and sense amplifier line pair equalization circuit 113. If the size of the PMOSs M13, M14 of the sense amplifier latch circuit 116 is set larger than the size of the NMOSs M9, M10 of the sense amplifier latch circuit 116, the data amplification ability of the sense amplifier latch circuit 116 can be enhanced and the amplification operation speed can be enhanced. This is advantageous when time for the cycle operation is shortened and is preferable, for example, in a high-frequency clock (high-speed clock) semiconductor memory in which the cycle operation speed is high. One example of the size is the gate width of a MOS transistor and the gate width of the PMOSs M13, M14 may be set larger than the gate width of the NMOSs M9, M10.

The sense amplifier driver and sense amplifier line pair equalization circuit 113 includes a sense amplifier driver circuit part and sense amplifier line pair equalization circuit part. In this example, an NMOS M34 and PMOS M37 configure the sense amplifier driver circuit part and NMOSs M11, M35, M38 and PMOSs M12, M36 configure the sense amplifier line pair equalization circuit part.

The NMOS M34 of the sense amplifier driver circuit part is controlled by a control signal SENp, one end thereof is supplied with the ground potential VSS and a sense amplifier activation signal n3 is output from the other end thereof. The NMOS M34 supplies the ground potential VSS as the sense amplifier activation signal n3 to the sense amplifier latch circuit 116 by turning on/off the control signal SENp. As a result, the N-channel side circuit part of the sense amplifier latch circuit 116 is driven. Likewise, the PMOS M37 is controlled by a control signal SEPn, one end thereof is supplied with the power supply potential VDD and a sense amplifier activation signal n4 is output from the other end thereof. The PMOS M37 supplies the power supply potential VDD as the sense amplifier activation signal n4 to the sense amplifier latch circuit 116 by turning on/off the control signal SEPn. As a result, the P-channel side circuit part of the sense amplifier latch circuit 116 is driven.

The NMOS M11 and PMOS M12 of the sense amplifier line pair equalization circuit part are connected in parallel between the paired sense amplifier lines n1 and n2. Likewise, the NMOS M35 and PMOS M36 are serially connected between wirings to which the sense amplifier activation signals n3 and n4 are transferred. Further, the NMOS M38 is connected between the wirings to which the sense amplifier activation signals n3 and n4 are transferred. The equalize potential VBL is applied to a connection node of the NMOS M35 and the PMOS M36.

The NMOSs M11, M35, M38 are controlled by a sense amplifier equalization signal EQLSAp and the PMOSs M12, M36 are controlled by an inverted signal EQLSAn of the signal EQLSAp. The NMOS M35 and PMOS M36 permit the equalization potential VBL to be respectively supplied to the wirings to which the sense amplifier activation signals n3 and n4 are transferred by turning on/off the sense amplifier equalization signal EQLSAp and inverted signal EQLSAn. Further, the NMOS M38 short-circuits the wirings to which the sense amplifier activation signals n3 and n4 are transferred. As a result, the potentials of the wirings to which the sense amplifier activation signals n3 and n4 are transferred are equalized to the equalization potential VBL. Also, the NMOS M11 and PMOS M12 short-circuit the paired sense amplifier lines n1, n2. As a result, the potentials of the paired sense amplifier lines n1, n2 are equalized.

The read gate circuit 114 includes NMOSs M15, M16, M17. One end of the NMOS M15 is connected to an output data line LDOt and one end of the NMOS M16 is connected to a complementary output data line LDOc. One end of the NMOS M17 is supplied with the ground potential VSS. The sense amplifier line n1 is connected to the gate of the NMOS M15 and the sense amplifier line n2 is connected to the gate of the NMOS M16. The gate of the NMOS M17 is supplied with a read select signal RSLp (RSLp<1> is shown in FIG. 2) and the NMOS M17 is controlled by the read select signal RSLp. The other ends of the NMOSs M15, M16, M17 are connected together as a common connection node.

The write buffer circuit 115 includes PMOSs M18, M19, M20, M21 and NMOSs M22, M23, M24, M25.

The PMOSs M18 to M21 are serially connected between the paired sense amplifier lines n1 and n2. The gate of the PMOS M18 is connected to an input data line LDIt. The gates of the PMOSs M19, M20 are supplied with a write select signal WSLn (WSLn<1> is shown in FIG. 2) and the PMOSs M19, M20 are controlled by the write select signal WSLn. A connection node of the PMOSs M19 and M20 is supplied with high level potential of the paired sense amplifier lines n1, n2 and paired bit lines BL, /BL, for example. One example of the high level potential is the power supply potential VDD. The gate of the PMOS M21 is connected to an input data line LDIc.

The NMOSs M22, M23 are serially connected between the sense amplifier line n1 and the input data line LDIc. The NMOSs M24, M25 are serially connected between the input data line LDIt and the sense amplifier line n2. The gates of the NMOSs M22, M25 are supplied with a data mask signal LDVp. The gates of the NMOSs M23, M24 are supplied with a write select signal WSLp (WSLp<1> is shown in FIG. 2) and the NMOSs M23, M24 are controlled by the write select signal WSLp. The write select signal WSLp is a complementary signal of the write select signal WSLn.

The write buffer circuit 115 determines whether or not write data of the paired input data lines LDIt, LDIc is supplied to the paired sense amplifier lines n1, n2 according to the on/off states of the write select signals WSLp, WSLn. The write buffer circuit 115 of this example has a data mask function. If the data mask signal LDVp is set to a low level, write data is not transferred to the paired sense amplifier lines n1, n2 even when the write select signals WSLp, WSLn are set in the on state.

In the semiconductor memory according to the present embodiment, the sense amplifier driver circuit 113 or the sense amplifier driver circuit and sense amplifier line pair equalization circuit 113 in this example is provided for each of a plurality of sense amplifier latch circuits 116. The sense amplifier driver circuits 113 supply the sense amplifier activation signals n3, n4 to the plurality of sense amplifier latch circuits 116.

Thus, the length of the wirings to which the sense amplifier activation signals n3, n4 are transferred can be made short by providing the sense amplifier driver circuit 113 for each of the plurality of sense amplifier latch circuits 116 and supplying the sense amplifier activation signals n3, n4 to each of the plurality of sense amplifier latch circuits 116. Therefore, the sense amplifier latch circuits 116 can be activated at higher speed in comparison with the semiconductor memory in which the sense amplifier driver circuits 113 are each commonly provided for a preset number of sense amplifier latch circuits 116. By thus activating the sense amplifier latch circuits 116 at high speed, the cycle operation can be performed at high speed.

Next, one example of the operation of the semiconductor memory according to the present embodiment is explained. A device for enhancing the cycle operation speed is made in one example of the present operation.

Figure 3:
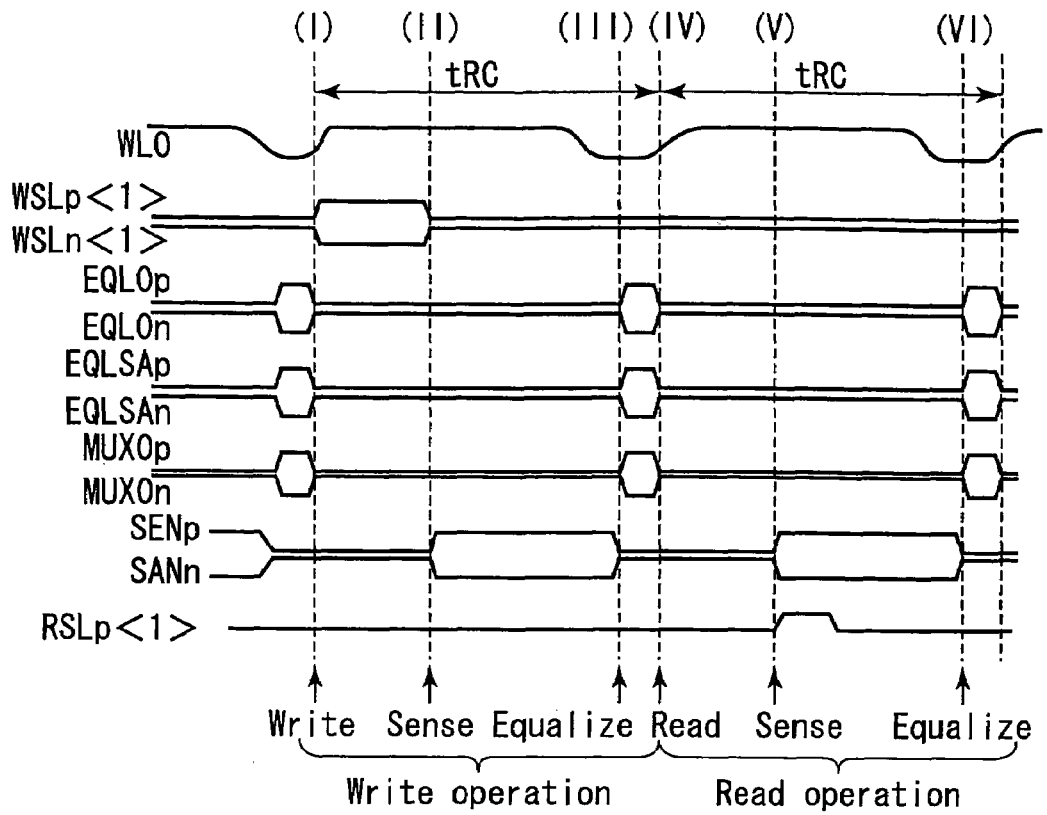
FIG. 3 is an operation waveform diagram showing one example of the operation of the semiconductor memory according to the embodiment of this invention.
Figure 4:
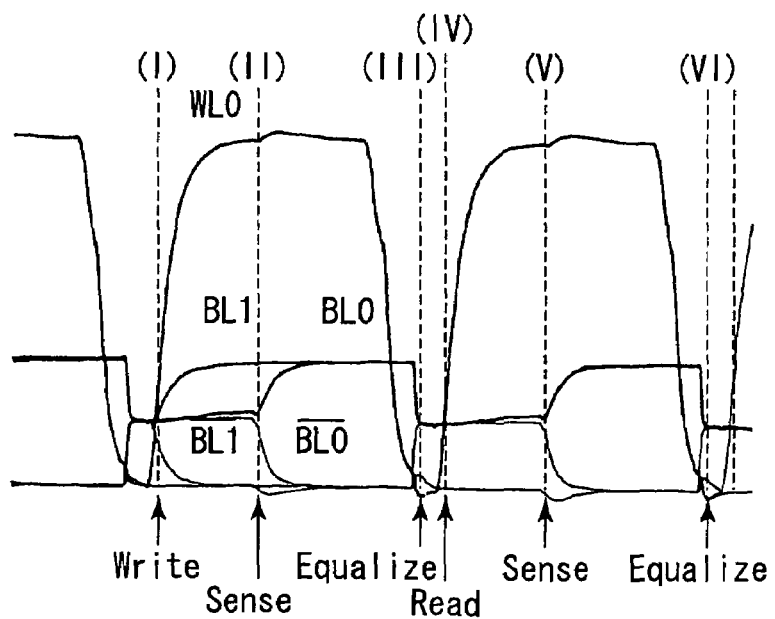
FIG. 4 is a potential waveform diagram showing variations in potentials of a word line and bit line pair according to one example of the operation shown in FIG. 3.

FIG. 3 is an operation waveform diagram showing one example of the operation of the semiconductor memory according to the embodiment of this invention and FIG. 4 is a potential waveform diagram showing variations in potentials of a word line and paired bit lines of the semiconductor memory of the present embodiment of this invention according to one example of the operation shown in FIG. 3.

tRC in FIG. 3 indicates a period of the cycle operation time. The example of the cycle operation in this invention is explained with reference to FIGS. 3, 4 while attention is given to the bit lines BL1, /BL1.

(Write Operation)

When the word line WL0 designated by a row address (not shown) is set to high level potential at the data write time, the write select signal WSLp<1> is set to the high level and the write select signal WSLn<1> is set to the low level at approximately the same time as the switching of the potential of the word line WL0, for example, as shown in FIGS. 3, 4. Thus, write data is transferred to the paired bit lines BL1, /BL1. At this time, the sense amplifier latch circuit 116 is not activated ((I) Write). Further, at this time, the paired bit lines (in the case of FIG. 4, only BL0, /BL0 are shown) other than the paired bit lines BL1, /BL1 which are selected by the write select signal are set in the read operation mode.

Next, for example, after the word line WL0 is set to fully high level potential, the sense amplifier driver control signal SENp is set to the high level and the sense amplifier driver control signal SEPn is set to the low level. As a result, the sense amplifier latch circuit 116 is activated and the amplification operation thereof is started. The sense amplifier latch circuit 116 amplifies data of an infinitesimal potential difference which is read out from the memory cell and supplied to the paired sense amplifier lines n1, n2 via the paired bit lines (in the case of FIG. 4, BL0, /BL0) and transfer gate circuit 112 and then holds the data ((II) Sense).

Next, when the operation of amplifying and holding the data of the bit lines is completed and the operation of writing data into the memory cell connected to the word line WL0 and rewriting data is completed, then the word line WL0 is set to the low level potential and the equalize signals EQL0p, EQL0n, EQLSAp, EQLSAn and transfer gate control signals MUX0p, MUX0n are activated to perform the equalization operation ((III) Equalization).

(Read Operation)

When the word line WL0 designated by the row address (not shown) is set to the high level potential at the data readout time, data read out from the memory cell is transferred as an infinitesimal potential difference to the paired sense amplifier lines n1, n2 via the paired bit lines (in FIG. 4, BL0, /BL0, BL1, /BL1 are shown) and transfer gate circuit 112 ((IV) Read).

After this, when a potential difference between the paired sense amplifier lines n1 and n2 becomes sufficiently large, the sense amplifier driver control signals SENp and SEPn are respectively set to the high level and low level. At this time, like the write operation, the sense amplifier latch circuit 116 is activated and the amplification operation thereof is started. The sense amplifier latch circuit 116 amplifies data of an infinitesimal potential difference which is read out to the paired sense amplifier lines n1, n2 and then holds the data. When readout data thus amplified and held is output, the read select signal RSLp<1> is set to the high level. As a result, data of the paired sense amplifier lines n1, n2 is output to the paired output data lines LDOt, LDOc via the read gate circuit 114 ((V) Sense).

When data is not output, the read select signal RSLp<1> is kept at the low level. In this case, data thus amplified and held is simply rewritten into the memory cell. Thus, a so-called data refresh operation is performed.

After this, like the write operation, the word line WL0 is set to the low level potential and the equalization signals EQL0p, EQL0n, EQLSAp, EQLSAn and transfer gate control signals MUX0p, MUX0n are activated to perform the equalization operation ((VI) Equalization).

One example of the operation is to transfer write data from the sense amplifier line pair n1, n2 to the selected bit line pair BL1, /BL1 among a plurality of bit line pairs at the data write time before the sense amplifier latch circuit 116 is activated. Therefore, for example, as shown in FIG. 14, the operation of inverting the potential of the selected bit line pair BL1, /BL1 can be omitted at the data write time. Thus, the operation speed of the write operation can be enhanced and the cycle operation speed can be further enhanced in comparison with the semiconductor memory shown in the document 1 or FIG. 14.

Next, one example of the wiring layout of the sense amplifier part 11 of the semiconductor memory according to the embodiment is explained. A device for enhancing the cycle operation speed is made in one example of the wiring layout.

Figure 5:
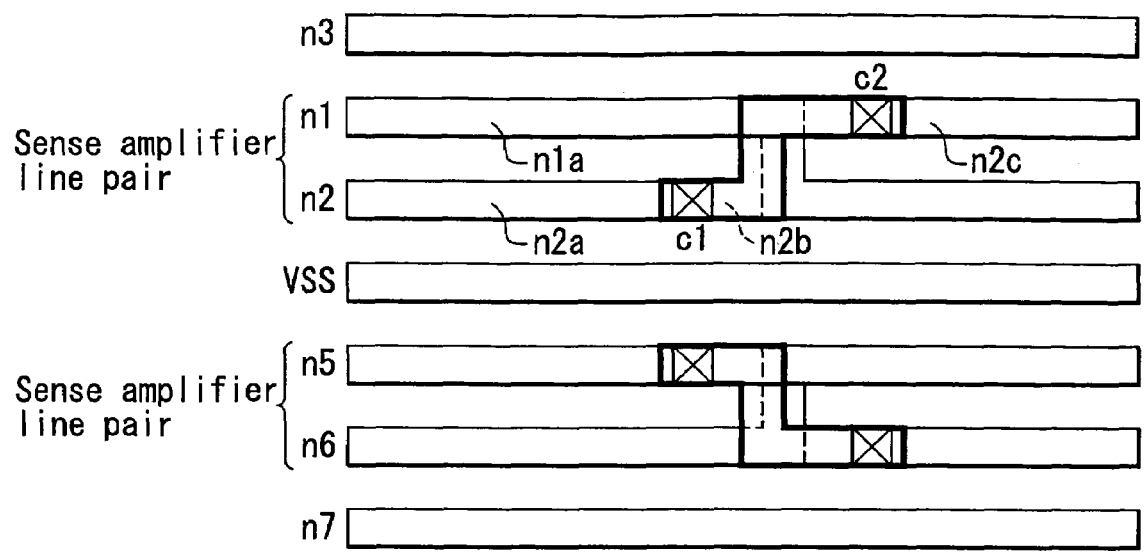
FIG. 5 is a plan view showing the wiring layout of the sense amplifier part of the semiconductor memory according to the embodiment of this invention.

FIG. 5 is a plan view schematically showing the wiring layout of the sense amplifier part 11.

As shown in FIG. 5, the device for enhancing the cycle operation speed in this example is made for a twist structure and shield wiring.

(Twist Structure)

As shown in FIG. 5, the sense amplifier line n2 includes three portions n2a, n2b, n2c. The portion n2a is connected to the portion n2b via a contact cl and the portion n2b is connected to the portion n2c via a contact c2. The portions n2a, n2c are wirings of the same layer and the portion n2b is a wiring of a layer different from the layer of the portions n2a, n2c. For example, the portion n2b is a wiring of a layer lying above the layer of the portions n2a, n2c.

The sense amplifier line n1 (n1a) is a wiring of the same layer as the portions n2a, n2c. The sense amplifier line n1 intersects the portion n2b of the sense amplifier line n2. Thus, the arrangement position of the sense amplifier line n1 is interchanged with the arrangement position of the sense amplifier line n2 and the paired sense amplifier lines n1, n2 configure a twist structure.

Paired sense amplifier lines n5, n6 adjacent to the paired sense amplifier lines n1, n2 configure the same twist structure as the paired sense amplifier lines n1, n2. The sense amplifier line pair n5, n6 is line symmetrical to the adjacent sense amplifier line pair n1, n2.

By configuring the sense amplifier line pair in the twist structure form, it is possible to suppress coupling of the sense amplifier line pairs in the sense amplifier part 11.

(Shield Wiring)

As shown in FIG. 5, in the sense amplifier part 11, the sense amplifier line pairs which are adjacent to each other are shielded so as not to be adjacent to each other on the wiring layout. One example of shielding is to arrange a wiring through which a signal used in the sense amplifier part 11 is transferred and a wiring to which fixed potential is applied between the sense amplifier line pairs which are adjacent to each other. In this example, a wiring to which fixed potential is applied, for example, a wiring (VSS) to which the ground potential VSS is applied is arranged between the sense amplifier lines n2 and n5. Further, a wiring through which a signal used in the sense amplifier part 11 is transferred, for example, a wiring (n3) through which the sense amplifier activation signal n3 is transferred is arranged between the sense amplifier line n1 and another sense amplifier line (not shown). Likewise, a wiring (n7) through which a sense amplifier activation signal n7 is transferred is arranged between the sense amplifier line n1 and another sense amplifier line (not shown). The wiring (VSS) to which the ground potential VSS is applied, the wiring (n3) through which the sense amplifier activation signal n3 is transferred and the wiring (n7) through which the sense amplifier activation signal n7 is transferred are wirings of the same layer as the portions n2a, n2b, n2c of the sense amplifier line n2 and the sense amplifier line n1 (n1a), for example.

By thus contriving the layout to arrange the sense amplifier line pairs so as not to set them directly adjacent to each other, coupling of the sense amplifier pairs with each other can be suppressed.

The shielding wiring is not limited to the present example and a wiring to which fixed potential of equalize potential VBL or the like is applied or another wiring lying in the sense amplifier part 11 can be used.

Next, the bit line pair equalization circuit of the semiconductor memory according to the embodiment is explained.

As shown in FIG. 2, the bit line pair equalization circuit 111 (111-1, 111-2) includes the CMOS type transfer gate. In FIG. 2, the CMOS type transfer gate configured by the PMOS M1 and NMOS M2 and the CMOS type transfer gate configured by the NMOS M32 and PMOS M33 are shown.

For example, the advantage of the CMOS type transfer gate is that a so-called "threshold voltage drop", that is, the phenomenon that the transfer potential is lowered by the threshold voltage of the NMOS does not occur in comparison with the transfer gate configured only by the NMOSs.

Figure 6:
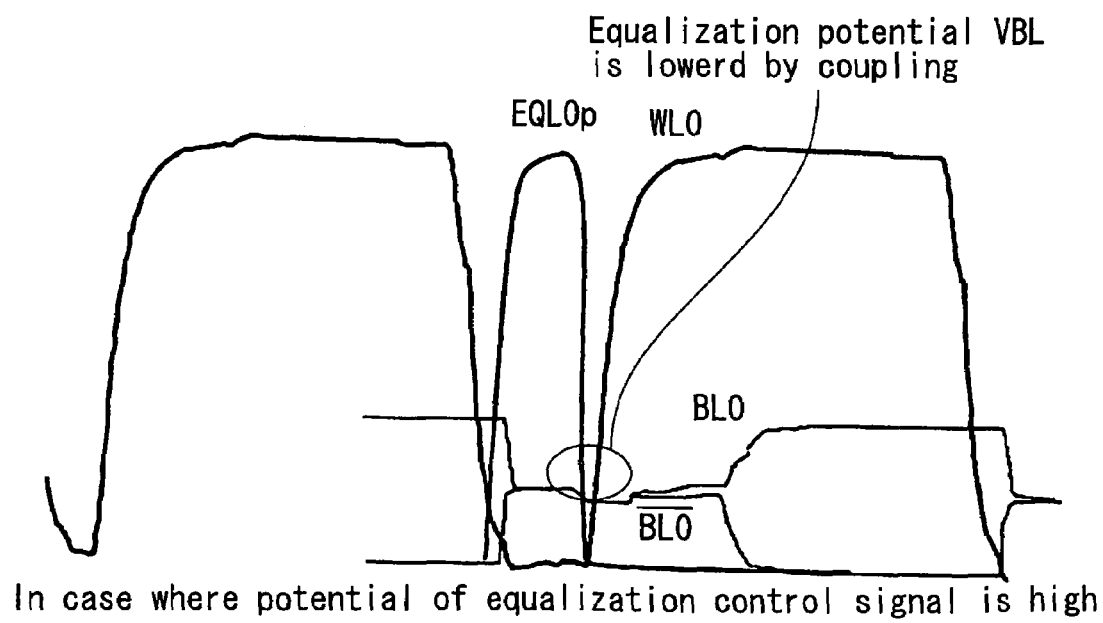
FIG. 6 is a potential waveform diagram showing a variation in the potential of a bit line pair equalize control signal of a general semiconductor memory.

Therefore, it is not necessary to use boosted potentials which are used to suppress the threshold voltage drop as the bit line pair equalization signals EQLp, EQLn supplied to the bit line pair equalization circuit 111. For example, in the semiconductor memory, boosted potential is used as potential which is used to drive the word line WL in many cases. Therefore, the potentials of the bit line pair equalization signals EQLp, EQLn are generally set to the same potential which is used to drive the word line WL. FIG. 6 shows a potential waveform of the general bit line pair equalization control signal EQLp.

As shown in FIG. 6, when the potential of the bit line pair equalization control signal EQLp is set to the same potential as the potential which is used to drive the word line WL, for example, the amplitude between the high level and the low level of the bit line pair equalization control signal EQLp becomes extremely large. Therefore, for example, when the bit line pair equalization control signal EQLp is transited from the high level to the low level, capacitive coupling occurs between the paired bit lines and the potential of the bit line pair becomes lower than the equalization potential VBL. If the potential of the bit line pair becomes lower than the equalization potential VBL, time required for reading out data which is infinitesimal potential from the memory cell becomes longer. In the worst case, for example, there occurs a possibility that an erroneous data read operation will be performed.

Therefore, in the semiconductor memory according to the present embodiment, the CMOS type transfer gate is used in the bit line pair equalization circuit 111.

Figure 7:
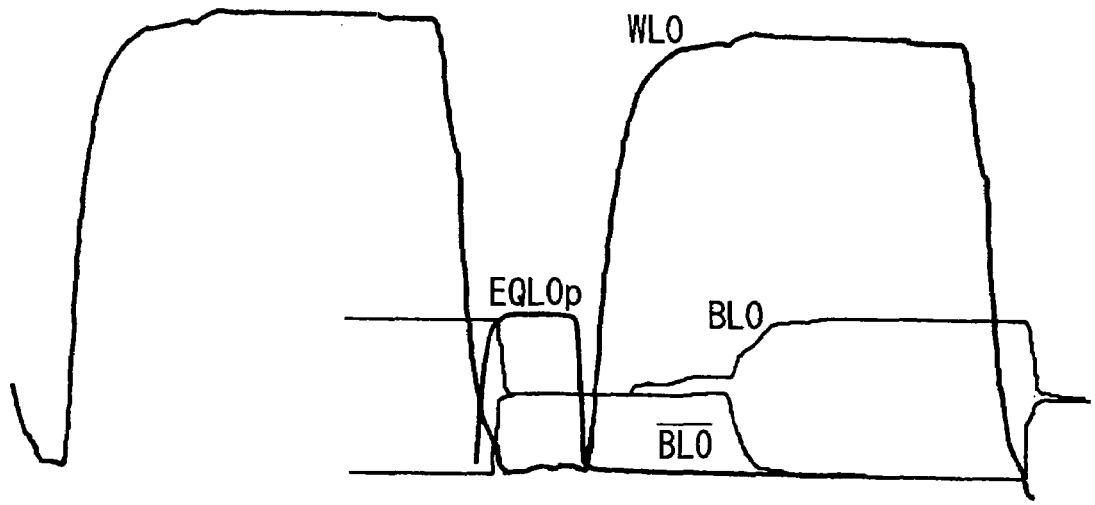
FIG. 7 is a potential waveform diagram showing a variation in the potential of a bit line pair equalize control signal of the semiconductor memory according to the embodiment of this invention.

Further, as shown in FIG. 7, for example, potentials of the bit line pair equalization signals EQLp, EQLn (in FIG. 7, only EQLp is shown) are set lower than the potential which is used to drive the word line WL. As shown in FIG. 7, one example of the potential is the same potential as the potential of the bit line pair (in FIG. 7, BL0, BL1 are shown).

For example, if the potentials of the bit line pair equalization signals EQLp, EQLn are set lower than the potential which is used to drive the word line WL, the amplitude between the high level and the low level of the bit line pair equalization signals EQLp, EQLn can be made small. Therefore, capacitive coupling occurring between the paired bit lines the when the bit line pair equalization signals EQLp, EQLn are transited from the high level to the low level can be suppressed.

In the semiconductor memory according to the embodiment, the same device can be applied to the sense amplifier line pair equalization circuit 113 and transfer gate 112 (112-1, 112-2). That is, the sense amplifier line pair equalization circuit 113 includes the CMOS type transfer gate configured by the PMOS M11 and NMOS M12. The potentials of the sense amplifier line pair equalization control signals EQLSAp, EQLSAn are set lower than the potential which is used to drive the word line WL.

Further, the transfer gate 112-1 includes a CMOS type transfer gate configured by the PMOS M5 and NMOS M6 and a CMOS type transfer gate configured by the PMOS M7 and NMOS M8. The potentials of the transfer gate control signals MUX0p, MUX0n are set lower than the potential which is used to drive the word line.

Likewise, the transfer gate 112-2 includes a CMOS type transfer gate configured by the PMOS M26 and NMOS M27 and a CMOS type transfer gate configured by the PMOS M28 and NMOS M29. The potentials of the transfer gate control signals MUX1p, MUX1n are set lower than the potential which is used to drive the word line.

Further, the CMOS type transfer gate has the following advantages.

Generally, the types of transistors are different depending on voltages used. Specifically, for example, the thicknesses of the gate insulating films of transistors are different depending on voltages used. A space larger than a space between transistors of the same type is required between transistors of different types. However, for example, if the CMOS type transfer gate is used as the transfer gate 112, potentials of the same level as the potential used for the transistors in the sense amplifier latch circuit 116 can be used for the control signals MUX0p, MUX0n. Therefore, transistors of the same type as the transistors used in the sense amplifier latch circuit 116 can be used in the transfer gate 112. Thus, it becomes unnecessary to provide a large space between the transfer gate 112 and the sense amplifier latch circuit 116. As a result, the circuit area of, for example, the sense amplifier part 11 can be reduced.

The advantage attained by reducing the circuit area can also be attained by using CMOS type transfer gates not only in the transfer gates 112 but also in the bit line pair equalization circuits 111 (111-1, 111-2) and sense amplifier line pair equalization circuits 113 and setting the potentials of the control signals used to control the circuits 111, 113 to the same potential level as the potential used for the transistors of the sense amplifier latch circuit 116.

Further, the sense amplifier part 11 with the high integration density and small area can be attained by configuring the bit line pair equalization circuit 111, transfer gates 112, sense amplifier line pair equalization circuit 113 and sense amplifier latch circuit 116 by use of transistors of the same type. For example, the sense amplifier part 11 with the small area can be advantageously used for a semiconductor memory obtained by finely dividing the memory cell array part 10 into a matrix form in order to enhance the operation speed, for example, for a segment array type semiconductor memory. For example, one example of the transistor of the same type is a transistor having the same gate insulating film thickness.

Next, the write buffer circuit 115 of the semiconductor memory according to the embodiment is explained below.

Figure 8:
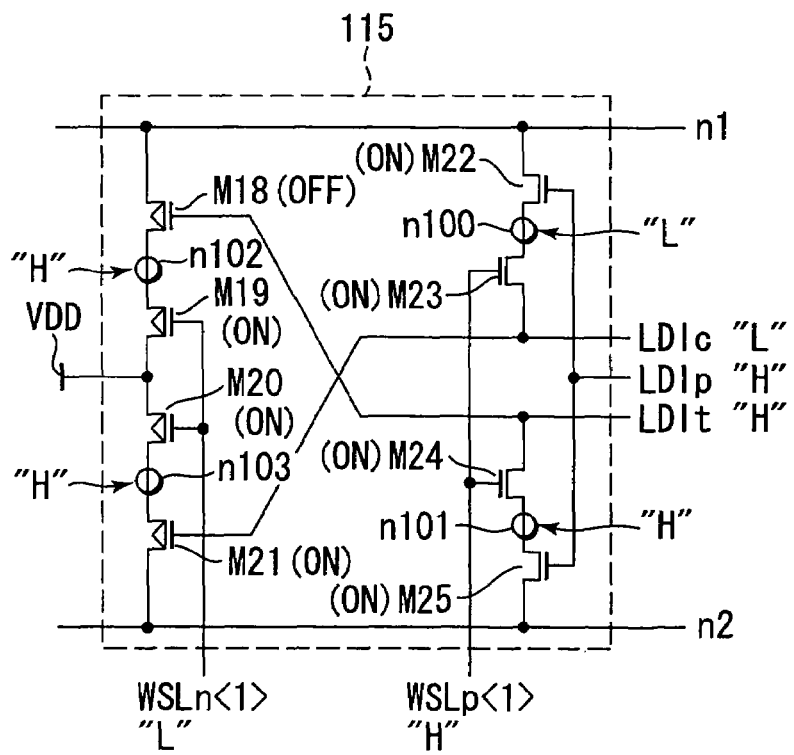
FIG. 8 is a circuit diagram showing one example of the potential state of a write buffer circuit of the semiconductor memory according to the embodiment of this invention at the time of the data write operation.
Figure 9:
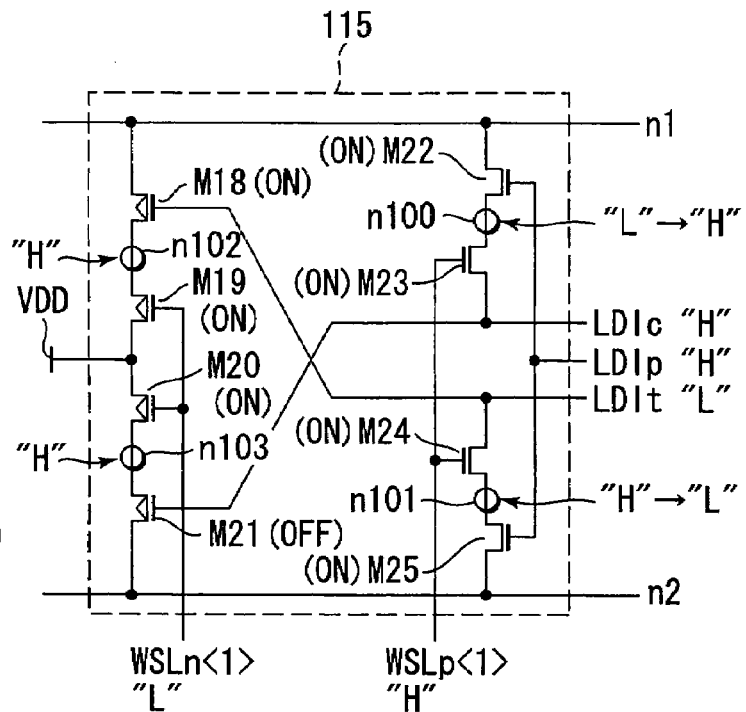
FIG. 9 is a circuit diagram showing one example of the potential state of a write buffer circuit of the semiconductor memory according to the embodiment of this invention at the time of the data write operation.

FIGS. 8 and 9 are circuit diagrams each showing one example of the potential state of the write buffer circuit 115 at the time of the data write operation.

First, as shown in FIG. 8, assume that input data which sets the true input data line LDIt of the paired input data lines LDIt, LDIc at "H" and sets the complementary input data line LDIc at "L" is input. The write buffer circuit 115 receives various control signals including a data mask signal LDVp of "H", write select signal WSLp<1> of "H" and write select signal WSLn<1> of "L".

The write buffer circuit 115 is a CMOS circuit.

The gates of the NMOSs M22, M25 are supplied with "LDVp=H" and the NMOSs M22, M25 are turned on. Likewise, the gates of the NMOSs M23, M24 are supplied with "WSLp<1>=H" and the NMOSs M23, M24 are turned on. By turning ON the NMOSs M24, M25, "LDIt=H" is supplied to the true sense amplifier line n2 via the NMOSs M24, M25. Likewise, by turning on the NMOSs M22, M23, "LDIc=L" is supplied to the complementary sense amplifier line n1 via the NMOSs M23, M22. At this time, the potential of a connection node n100 of the NMOSs M22 and M23 is set to "L" and the potential of a connection node n101 of the NMOSs M24 and M25 is set to "H".

Further, the gate of the PMOS M18 is supplied with "LDIt=H" and the PMOS M18 is turned off. The gates of the PMOSs M19 to M21 are supplied with "WSLn<1>=L" and "LDIc=L" and the PMOSs M19 to M21 are turned on. By turning on the PMOSs M20, M21, the power supply potential VDD is supplied to the true sense amplifier line n2 via the PMOSs M20, M21. At this time, the potential of a connection node n103 of the PMOSs M20 and M21 is set to "H". Further, since the PMOS M19 is also turned on, the potential of a connection node n102 of the PMOSs M19 and M18 is also set to "H".

After this, although not shown in the drawing, the data mask signal LDVp is set to "L", the write select signal WSLp<1> is set to "L" and the write select signal WSLn<1> is set to "H". As a result, the paired input data lines LDIt, LDIc are electrically isolated from the paired sense amplifier lines n1, n2. Further, both of the true input data line LDIt and complementary input data line LDIc are precharged to "H".

The write buffer circuit 115 performs the above operation at the data write time. At the time of this operation, for example, the potential of the connection node n100 of the series-connected NMOSs M22 and M23 is set to "L" and the potential of the connection node n101 of the series-connected NMOSs M24 and M25 is set to "H". At this time, there occurs a possibility that the above potentials remain on the connection nodes n100, n101 until data is next written. Even when the potentials remain, no problem occurs if the same data is written. However, if different data is written, there occurs a possibility that an influence will be given to the data transmission operation.

For example, as shown in FIG. 9, assume that the potential of "L" remains on the connection node n100 and the potential of "H" remains on the connection node n101. Further, assume that write data which sets the true input data line LDIt and complementary input data line LDIc to "L" and "H", respectively, is input. In this case, the potential of the connection node n100 is transited from "L" to "H" and the potential of the connection node n101 is transited from "H" to "L". That is, the same operation as the operation which reverses the potential relation of the paired bit lines shown in FIG. 14 occurs in certain nodes in the write buffer circuit 115, in this example, in the connection nodes n100, n101. If the operation which reverses the potential relation occurs in certain nodes in the write buffer circuit 115, the data transmission operation from the input data line pair LDIt, LDIc to the sense amplifier line pair n1, n2 is delayed.

When occurrence of the above phenomenon becomes significant to give an influence on shortening of the cycle operation time, the write buffer circuit 115 may be operated as follows, for example.

Briefly speaking, the potentials of certain nodes in the write buffer circuit 115 are equalized by use of at least one of the bit line pair equalization circuit 111 and sense amplifier line pair equalization circuit 113. One example of the improved data writing operation of the write buffer circuit 115 is explained below on the assumption that the bit line pair equalization circuit 111 is used.

Figure 10:
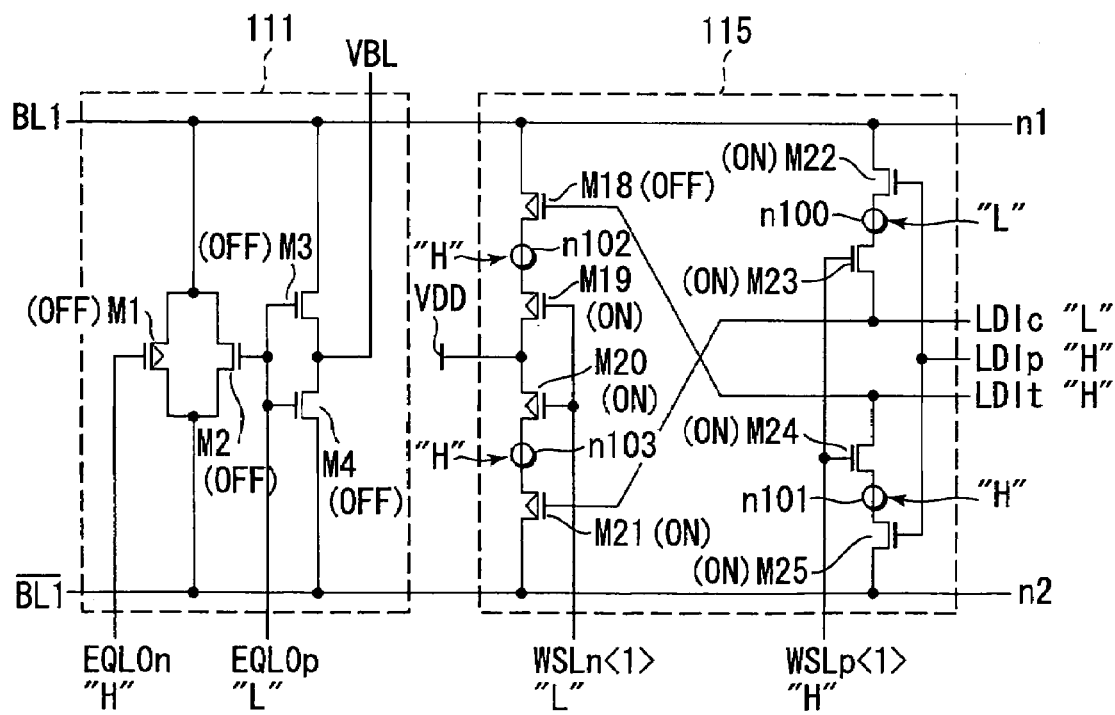
FIG. 10 is a circuit diagram showing one example of the potential state of a write buffer circuit of the semiconductor memory according to the embodiment of this invention at the time of the improved data write operation.
Figure 11:
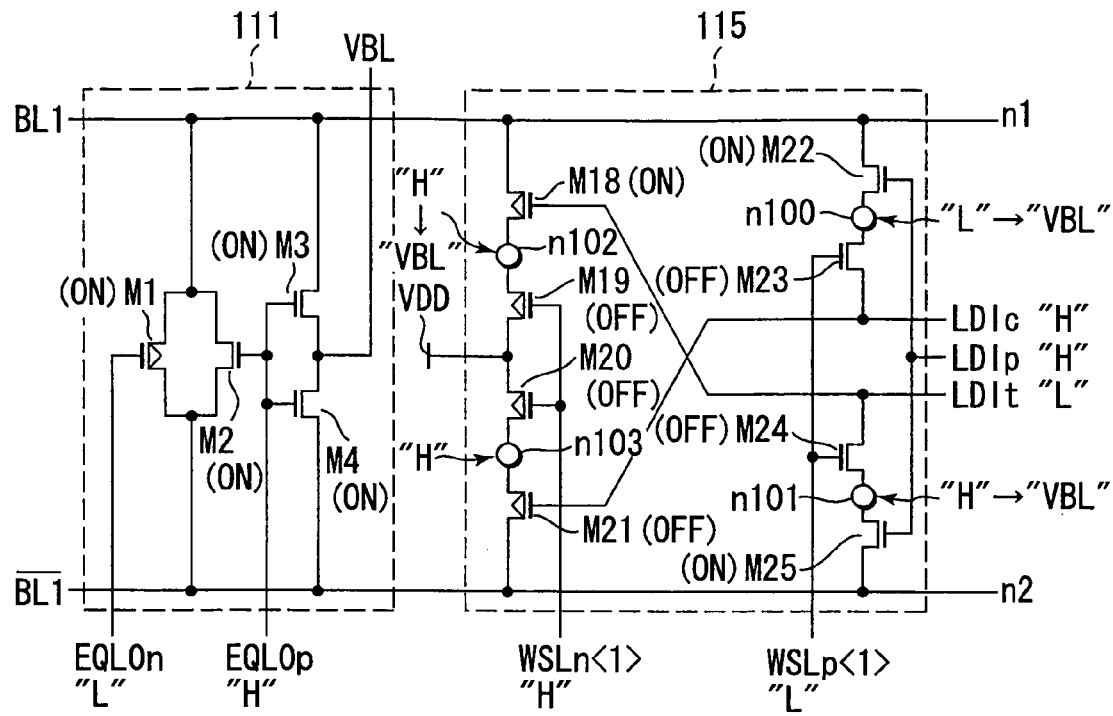
FIG. 11 is a circuit diagram showing one example of the potential state of a write buffer circuit of the semiconductor memory according to the embodiment of this invention at the time of the improved data write operation.
Figure 12:
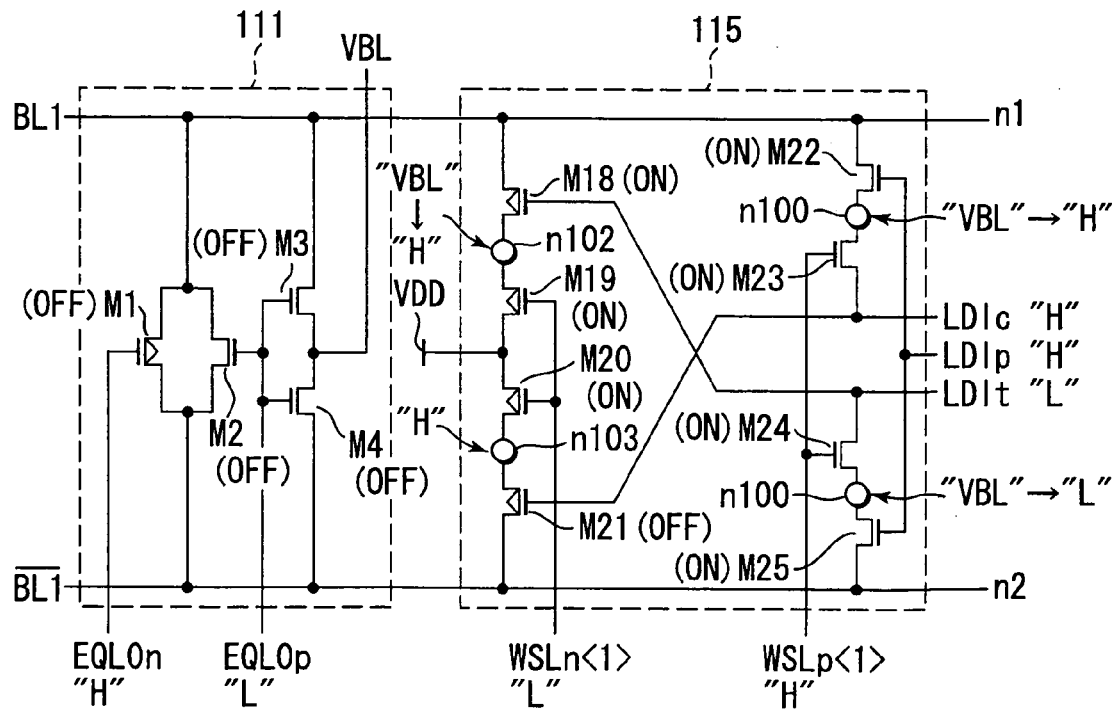
FIG. 12 is a circuit diagram showing one example of the potential state of a write buffer circuit of the semiconductor memory according to the embodiment of this invention at the time of the improved data write operation.
Figure 13:
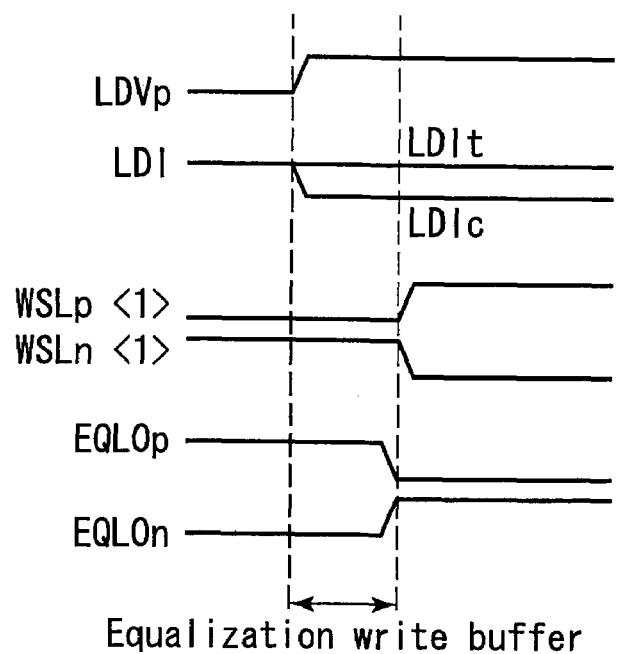
FIG. 13 is an operation waveform diagram showing one example of the improved data write operation of the semiconductor memory according to the embodiment of this invention.

FIGS. 10, 11 and 12 are circuit diagrams each showing one example of the potential state at the time of the improved data write operation of the write buffer circuit 115. FIG. 13 is an operation waveform diagram showing one example of the improved data write operation.

FIG. 10 shows one example of the state in which write data is transmitted from the input data line pair LDIt, LDIc to the sense amplifier line pair n1, n2 and bit line pair BL1, /BL1. In the example shown in FIG. 10, a state in which data causing the true input data line LDIt and complementary input data line LDIc to be respectively set to "H" and "L" is input is shown. At this time, the write select signals WSLn<1> and WSLp<1> are respectively set at "L"

and "H" and the write buffer circuit 115 is made active. Further, the data mask signal LDVp is set at "H" and no write mask is made for the sense amplifier line pair n1, n2 and bit line pair BL1, /BL1. The bit line pair equalization control signals EQL0n and EQL0p are respectively set at "H" and "L" and the bit line pair equalization circuit 111 is made non-active.

In this case, the potential of the true sense amplifier line n2 and the potential of the true bit line /BL1 are set to "H and the potential of the complementary sense amplifier line n1 and the potential of the complementary bit line BL1 are set to "L". Further, the potential of the connection node n100 is set at "L" and the potential of the connection node n101 is set at "H". In addition, the potentials of the connection nodes n102 and n103 are set at "H".

After this, although not shown in the drawing, the data mask signal LDVp is set to "L" and the write select signals WSLp<1> and WSLn<1> are respectively set to "L" and "H" to electrically isolate the input data line pair LDIt, LDIc from the sense amplifier line pair n1, n2. Further, the true input data line LDIt and complementary input data line LDIc are both precharged to "H". In addition, the bit line pair equalization control signals EQL0n and EQL0p are respectively set to "L" and "H" to equalize the potentials of the bit line pair BL1, /BL1 to the equalization potential VBL. Also, the potentials of the sense amplifier line pair n1, n2 are equalized to the equalization potential VBL by use of the sense amplifier line pair equalization circuit 113 which is not shown in FIG. 10.

Next, as shown in FIG. 11, assume that input data which sets the true input data line LDIt at "L" and sets the complementary input data line LDIc at "H" is input to the write buffer circuit 115. At this time, the data mask signal LDVp is set to "H" to turn on the NMOSs M22, M25. As a result, the connection node n100 is electrically connected to the sense amplifier line n1 and the connection node n101 is electrically connected to the sense amplifier line n2. The write select signals WSLn<1> and WSLp<1> are respectively kept at "H" and "L" to turn off the PMOSs M19, M20 and NMOSs M23, M24. The bit line pair equalization control signals EQL0n and EQL0p are respectively kept at "L" and "H" to set the bit line pair equalization circuit 111 into the active state. The sense amplifier line pair equalization circuit 113 (not shown in FIG. 11) is also set into an active state, for example.

Thus, the potential of the connection node n100 is transited from "L" to the equalization potential VBL and the potential of the connection node n101 is transited from "H" to the equalization potential VBL. Since the gate of the PMOS M18 is supplied with "LDIt=L" and the PMOS M18 is turned on, the potential of the connection node n102 is transited from "H" to the equalization potential VBL.

Next, as shown in FIG. 12, the bit line pair equalization control signals EQL0n and EQL0p are respectively set to "H" and "L" to deactivate the bit line pair equalization circuit 111. In this case, the sense amplifier line pair equalization circuit 113 (not shown in FIG. 12) is also set into a non-active state. The write select signals WSLn<1> and WSLp<1> are respectively set to "L" and "H" to turn on the PMOSs M19, M20 and NMOSs M23, M24.

Thus, the potential of the connection n100 is transited from the equalization potential VBL to "H" and the potential of the connection node n101 is transited from the equalization potential VBL to "L".

In one example of the improved operation, the data mask signal LDVp is input before the write select signals WSLp and WSLn are input to the write buffer circuit 115. Then, the potentials of the connection nodes n100 and n101 are equalized by use of at least one of the bit line pair equalization circuit 111 and sense amplifier line pair equalization circuit 113.

For example, as shown in FIG. 13, a period of time (write buffer equalize period) in which the equalization operation in the write buffer circuit 115 is performed is set before a period in which the write select signals WSLp and WSLn are input to the write buffer circuit 115. As a result, the operation for reversing the potential relation of certain nodes in the write buffer circuit 115 can be made unnecessary. Therefore, a period of time from the time when the write select signals WSLp and WSLn are input to the write buffer circuit 115 until write data is transmitted from the input data line pair LDIt, LDIc to the sense amplifier line pair n1, n2 can be shortened and the operation can be suppressed from being delayed.

Thus, according to the embodiment of this invention, a semiconductor integrated circuit device having a semiconductor memory in which the cycle operation speed can be enhanced can be provided.

Further, since the cycle operation speed in the semiconductor memory according to the embodiment of this invention can be enhanced, the semiconductor memory is particularly useful for a product such as a network equipment or cache memory which is required to have a high-speed cycle operation.

This invention has been explained with reference to one embodiment, but this invention is not limited to the embodiment and can be variously modified without departing from the technical scope thereof. Of course, the embodiment is not only one embodiment. For example, the dynamic memory cell used in the DRAM or PSRAM (Pseudo-SRAM) is shown as an example, but a memory cell other than the dynamic memory cell can also be used.

Further, the above embodiment contains inventions of various stages and the inventions of various stages can be extracted by adequately combining a plurality of constituents disclosed in the embodiment.

Further, the embodiment is explained based on the example in which the invention is applied to the semiconductor memory, but this invention is not limited to the semiconductor memory. A semiconductor integrated circuit device containing the semiconductor memory, for example, a processor or system LSI is contained in the scope of this invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
   a memory cell array including a plurality of word lines, a plurality of bit line pairs and memory cells arranged at intersections between the plurality of word lines and the plurality of bit line pairs;
   a plurality of sense amplifier line pairs respectively connected to the plurality of bit line pairs, the sense amplifier line pairs having a twist structure;
   a plurality of sense amplifier latch circuits which are respectively connected to the plurality of sense amplifier line pairs and each of which amplifies and holds data of the memory cell;

sense amplifier driver circuits which respectively supply sense amplifier activation signals to the plurality of sense amplifier latch circuits, the sense amplifier driver circuit being provided for each of the plurality of sense amplifier latch circuits and supplying the sense amplifier activation signal to a corresponding one of the plurality of sense amplifier latch circuits, wherein transfer of write data to a selected sense amplifier line pair among the plurality of sense amplifier line pairs is started before the sense amplifier latch circuit is activated at data write time;

bit line pair equalization circuits respectively provided for the plurality of bit line pairs; and sense amplifier line pair equalization circuits respectively provided for the plurality of sense amplifier line pairs;

wherein each of the bit line pair equalization circuits and sense amplifier line pair equalization circuits includes a CMOS type transfer gate and potential of a bit line pair equalization control signal supplied to the bit line pair equalization circuits and potential of a sense amplifier line pair equalization control signal supplied to the sense amplifier line pair equalization circuits are set lower than potential used to drive the plurality of word lines.

2. The device according to claim 1, wherein signal lines required in the sense amplifier latch circuit or wirings to which fixed potential is applied are arranged between the plurality of sense amplifier line pairs.

3. The device according to claim 1, further comprising:
transfer gates provided between the plurality of sense amplifier line pairs and the plurality of bit line pairs,
wherein the transfer gate includes a CMOS type transfer gate and potential of a transfer gate control signal supplied to the transfer gate is lower than potential used to drive the plurality of word lines.

4. The device according to claim 1, wherein the bit line pair has a twist structure.

5. The device according to claim 1, wherein each of the plurality of sense amplifier latch circuits includes a CMOS type sense amplifier latch circuit and the size of a P-channel transistor in the CMOS type sense amplifier latch circuit is larger than the size of an N-channel transistor in the CMOS type sense amplifier latch circuit.

6. The device according to claim 5, wherein gate width of the P-channel transistor is larger than gate width of the N-channel transistor.

7. The device according to claim 1, wherein the potential of the bit line pair equalization control signal and the potential of the sense amplifier line pair equalization control signal are set to the same level as the potential used in the plurality of sense amplifier latch circuits.

8. The device according to claim 3, wherein the potential of the transfer gate control signal is set to the same level as the potential used in the plurality of sense amplifier latch circuits.

9. The device according to claim 7, wherein a type of the transistors which configure the CMOS type transfer gate is the same as a type of the transistors which configure the plurality of sense amplifier latch circuits.

10. The device according to claim 8, wherein a type of the transistors which configure the CMOS type transfer gate is the same as a type of the transistors which configure the plurality of sense amplifier latch circuits.

11. The device according to claim 9, wherein thickness of a gate insulating film of each of the transistors which configure the CMOS type transfer gate is the same as thickness of a gate insulating film of each of the transistors which configure the plurality of sense amplifier latch circuits.

12. The device according to claim 10, wherein thickness of a gate insulating film of each of the transistors which configure the CMOS type transfer gate is the same as thickness of a gate insulating film of each of the transistors which configure the plurality of sense amplifier latch circuits.

13. A semiconductor integrated circuit device comprising:
a memory cell array including a plurality of word lines, a plurality of bit line pairs and memory cells arranged at intersections between the plurality of word lines and the plurality of bit line pairs;

a plurality of sense amplifier line pairs respectively connected to the plurality of bit line pairs, the sense amplifier line pairs having a twist structure;

a plurality of sense amplifier latch circuits which are respectively connected to the plurality of sense amplifier line pairs and each of which amplifies and holds data of the memory cell;

sense amplifier driver circuits which respectively supply sense amplifier activation signals to the plurality of sense amplifier latch circuits, the sense amplifier driver circuit being provided for each of the plurality of sense amplifier latch circuits and supplying the sense amplifier activation signal to a corresponding one of the plurality of sense amplifier latch circuits, wherein transfer of write data to a selected sense amplifier line pair among the plurality of sense amplifier line pairs is started before the sense amplifier latch circuit is activated at data write time;

bit line pair equalization circuits respectively provided for the plurality of bit line pairs;

sense amplifier line pair equalization circuits respectively provided for the plurality of sense amplifier line pairs; and write buffer circuits respectively provided for the plurality of sense amplifier line pairs;

wherein the write buffer circuit includes a first series-connected transistors serially connected between a true sense amplifier line and a true write data line and a second series-connected transistors serially connected between a complementary sense amplifier line and a complementary write data line and the write buffer circuit equalizes potential of a connection node in the first series-connected transistors and potential of a connection node in the second series-connected transistors by use of at lest one of the bit line pair equalization circuits and sense amplifier line pair equalization circuits before write data is transmitted to the true sense amplifier line and complementary sense amplifier line via the first and second series-connected transistors.

14. The device according to claim 13, wherein signal lines required in the sense amplifier latch circuit or wirings to which fixed potential is applied are arranged between the plurality of sense amplifier line pairs.

15. The device according to claim 13, further comprising:
transfer gates provided between the plurality of sense amplifier line pairs and the plurality of bit line pairs,
wherein the transfer gate includes a CMOS type transfer gate and potential of a transfer gate control signal supplied to the transfer gate is lower than potential used to drive the plurality of word lines.

16. The device according to claim 13, wherein the bit line pair has a twist structure.

17. The device according to claim 13, wherein each of the plurality of sense amplifier latch circuits includes a CMOS type sense amplifier latch circuit and the size of a P-channel transistor in the CMOS type sense amplifier latch circuit is larger than the size of an N-channel transistor in the CMOS type sense amplifier latch circuit.

18. The device according to claim 13, wherein gate width of the P-channel transistor is larger than gate width of the N-channel transistor.

19. The device according to claim 13, wherein the potential of the bit line pair equalization control signal and the potential of the sense amplifier line pair equalization control signal are set to the same level as the potential used in the plurality of sense amplifier latch circuits.

20. The device according to claim 15, wherein the potential of the transfer gate control signal is set to the same level as the potential used in the plurality of sense amplifier latch circuits.

* * * * *